United States Patent
Ebbecke

(10) Patent No.: US 12,532,577 B2
(45) Date of Patent: Jan. 20, 2026

(54) RADIATION-EMITTING SEMICONDUCTOR BODY AND METHOD FOR PRODUCING SAME

(71) Applicant: ams-OSRAM International GmbH, Regensburg (DE)

(72) Inventor: Jens Ebbecke, Rohr in Niederbayern (DE)

(73) Assignee: ams-OSRAM International GmbH, Regensburg (DE)

(*) Notice: Subject to any disclaimer, the term of this patent is extended or adjusted under 35 U.S.C. 154(b) by 413 days.

(21) Appl. No.: 17/905,929

(22) PCT Filed: Feb. 22, 2021

(86) PCT No.: PCT/EP2021/054312
§ 371 (c)(1),
(2) Date: Sep. 8, 2022

(87) PCT Pub. No.: WO2021/175635
PCT Pub. Date: Sep. 10, 2021

(65) Prior Publication Data
US 2023/0120369 A1    Apr. 20, 2023

(30) Foreign Application Priority Data

Mar. 6, 2020    (DE) .................... 102020106113.7

(51) Int. Cl.
*H10H 20/814*  (2025.01)
*H10H 20/01*   (2025.01)
*H10H 20/824*  (2025.01)

(52) U.S. Cl.
CPC ...... *H10H 20/8142* (2025.01); *H10H 20/013* (2025.01); *H10H 20/018* (2025.01); *H10H 20/824* (2025.01)

(58) Field of Classification Search
CPC ..... H01L 33/06; H01L 33/0062; H01L 33/30; H01L 33/105; H01L 33/0093; H01L 33/025; H01L 33/24
See application file for complete search history.

(56) References Cited

U.S. PATENT DOCUMENTS

| 5,708,674 A | 1/1998 | Beernink et al. |
| 6,844,565 B2 | 1/2005 | Lell et al. |

(Continued)

FOREIGN PATENT DOCUMENTS

| DE | 102010026518 A1 | 1/2012 |
| JP | 2003524901 A | 8/2003 |

(Continued)

*Primary Examiner* — Bitew A Dinke
(74) *Attorney, Agent, or Firm* — Slater Matsil, LLP

(57) ABSTRACT

In an embodiment a radiation emitting semiconductor body includes a first semiconductor region of a first conductivity type, a second semiconductor region of a second conductivity type and an active region located between the first semiconductor region and the second semiconductor region, wherein the active region comprises InGaAlP, wherein the first conductivity type is n-conductive and the second conductivity type is p-conductive, wherein the active region has a larger band gap in an edge region of the semiconductor body than in a central region of the semiconductor body, and wherein a band gap of the second semiconductor region in the edge region and in the central region is the same.

17 Claims, 1 Drawing Sheet

(56) References Cited

U.S. PATENT DOCUMENTS

| | | | |
|---|---|---|---|
| 9,018,618 B1* | 4/2015 | Lee | H01S 5/34333 257/14 |
| 9,048,383 B2 | 6/2015 | Mayer et al. | |
| 9,293,637 B2 | 3/2016 | Fujii et al. | |
| 9,455,373 B2 | 9/2016 | Yokozeki et al. | |
| 10,396,241 B1 | 8/2019 | Perkins | |
| 2003/0132454 A1* | 7/2003 | Lell | H01S 5/2232 257/200 |
| 2004/0184499 A1* | 9/2004 | Kondo | H01L 33/145 372/45.01 |
| 2006/0163586 A1* | 7/2006 | Denbaars | H10H 20/833 257/E33.021 |
| 2010/0258822 A1* | 10/2010 | Kobayashi | H01L 33/44 257/E33.001 |
| 2010/0283035 A1* | 11/2010 | Tanaka | H01L 33/305 257/13 |
| 2013/0105836 A1* | 5/2013 | Yokozeki | H01L 33/02 257/E33.014 |
| 2013/0168638 A1* | 7/2013 | Park | H10H 20/812 257/13 |
| 2013/0341663 A1* | 12/2013 | DenBaars | H01L 33/145 257/98 |
| 2016/0197232 A1 | 7/2016 | Bour et al. | |
| 2017/0170360 A1* | 6/2017 | Bour | H10H 20/84 |
| 2017/0207365 A1* | 7/2017 | Grundmann | H10H 20/825 |
| 2017/0213934 A1* | 7/2017 | Grundmann | H01L 33/30 |
| 2018/0047872 A1* | 2/2018 | Grundmann | H01L 33/145 |
| 2021/0126164 A1* | 4/2021 | Broell | H01L 33/06 |
| 2022/0376134 A1* | 11/2022 | Biebersdorf | H01L 33/06 |
| 2023/0023759 A1* | 1/2023 | Ebbecke | H01L 33/005 |

FOREIGN PATENT DOCUMENTS

| | | | |
|---|---|---|---|
| JP | 2006190854 A | * | 7/2006 |
| JP | 2013110374 A | | 6/2013 |
| JP | 2015035465 A | | 2/2015 |

* cited by examiner

RADIATION-EMITTING SEMICONDUCTOR BODY AND METHOD FOR PRODUCING SAME

This patent application is a national phase filing under section 371 of PCT/EP2021/054312, filed Feb. 22, 2021, which claims the priority of German patent application 102020106113.7, filed Mar. 6, 2020, each of which is incorporated herein by reference in its entirety.

TECHNICAL FIELD

A radiation emitting semiconductor body is specified. Furthermore, a radiation emitting semiconductor chip and a method for producing a radiation emitting semiconductor body are specified.

SUMMARY

Embodiments provide a radiation emitting semiconductor body, which has a particularly high efficiency. Further embodiments provide a radiation emitting semiconductor chip and a method for producing such a radiation emitting semiconductor body.

For example, the radiation emitting semiconductor body is based on a III-V compound semiconductor material. The compound semiconductor material is preferably a phosphide compound semiconductor material.

The radiation emitting semiconductor body is configured to emit electromagnetic radiation. For example, the electromagnetic radiation emitted by the semiconductor body is visible light, in particular red light. In this case, a peak wavelength of the emitted electromagnetic radiation is in a red wavelength region. That is, the peak wavelength of the electromagnetic radiation emitted from the radiation emitting semiconductor body is, for example, between 630 nm and 750 nm inclusive.

The semiconductor body has a main extension plane. A vertical direction extends perpendicular to the main extension plane and lateral directions extend parallel to the main extension plane.

The radiation emitting semiconductor body has an extension which is, for example, at most 500 µm, in particular at most 10 µm, in lateral directions.

According to at least one embodiment, the semiconductor body comprises a first semiconductor region of a first conductivity type. The first semiconductor region comprises at least a first semiconductor layer. Further, the first semiconductor region can comprise a first semiconductor layer sequence. For example, the first semiconductor region is n-doped and thus formed n-conductive. Thus, in this case, the first conductivity type is an n-type conductivity type.

According to at least one embodiment, the radiation emitting semiconductor body comprises a second semiconductor region of a second conductivity type. The second semiconductor region is arranged in vertical direction, for example, above the first semiconductor region.

The second semiconductor region comprises at least a second semiconductor layer. Furthermore, the second semiconductor region can comprise a second semiconductor layer sequence. For example, the second semiconductor region is p-doped and thus formed p-conductive. Thus, in this case, the first conductivity type is a p-type conductivity type.

For example, the first semiconductor region and/or the second semiconductor region comprise $In_xAl_{1-x}P$, wherein $0 \leq x \leq 1$. That is, the first semiconductor region and/or the second semiconductor region comprise/comprises indium aluminum phosphide, for example.

The second semiconductor region has a thickness in the vertical direction of, for example, at least 10 nm and at most 5 µm, in particular in about 200 nm.

According to at least one embodiment, the radiation emitting semiconductor body comprises an active region between the first semiconductor region and the second semiconductor region. That is, the active region is arranged between the first semiconductor region and the second semiconductor region. The active region is configured to generate electromagnetic radiation during operation.

For example, the active region is in direct contact with the first semiconductor region and/or with the second semiconductor region. Alternatively, a barrier layer can be arranged on the active region. The barrier layer is arranged between the active region and the second semiconductor region, for example. In this case, the barrier layer is in direct contact with the active region and the second semiconductor region. The barrier layer has a thickness in the vertical direction of, for example, at least 5 nm and at most 200 nm, in particular at least 10 nm and at most 100 nm.

The active region has a thickness in the vertical direction of, for example, at least 2 nm and at most 500 nm, in particular at least 5 nm and at most 100 nm.

For example, the active region includes a pn junction for generating the electromagnetic radiation, such as a double heterostructure, a single quantum well (SQW) structure, or a multiple quantum well (MQW) structure.

Further, the active region comprises, for example, $In_xGa_yAl_{1-x}P$, wherein $0 \leq x \leq 1$ and $0 \leq y \leq 1$. That is, the active region comprises, for example, indium gallium aluminum phosphide. If the semiconductor body has the barrier layer, the barrier layer comprises, for example, undoped $In_xGa_yAl_{1-x}P$, wherein $0 \leq x \leq 1$ and $0 \leq y \leq 1$.

According to at least one embodiment of the radiation emitting semiconductor body, the active region in an edge region of the semiconductor body has a larger band gap than in a central region of the semiconductor body. For example, the active region has a first band gap in the central region. Furthermore, the active region has a second band gap in the edge region, for example. In this case, the first band gap is smaller than the second band gap. In particular, the first band gap is smaller than the second band gap on average and/or at each location.

The first band gap is predetermined, for example, by a first distance of a conduction band to a valence band in the active region in the central region. The second band gap is predetermined, for example, by a second distance of the conduction band to the valence band in the active region in the edge region. In particular, the valence band of the active region in the central region is continuously connected to the valence band of the active region in the edge region. Furthermore, the conduction band of the active region in the central region is continuously connected to the conduction band of the active region in the edge region, in particular. The band gap of the active region thus increases continuously, in particular from the central region to the edge region.

The edge region ends where the second bandgap has decreased by, for example, 10%, in particular 15%, of a difference between the second bandgap and the first bandgap. The central region ends where the first band gap has increased by, for example, 10%, in particular 15%, of the difference. That is, the edge region and the central region are spaced apart in lateral directions.

The edge region of the semiconductor body completely surrounds the central region of the semiconductor body in the lateral direction, for example. The edge region is formed contiguously in the lateral direction, for example. The edge region surrounds the central region, for example, in a frame-like or ring-like manner. For example, the edge region extends from at least one side surface of the semiconductor body into the semiconductor body in the lateral direction.

The edge region of the semiconductor body has a width. The width of the edge region is the minimum extension in lateral directions from the side surface of the semiconductor body to an end of the edge region where the second bandgap has decreased by, for example, 10%, in particular 15%, of the difference between the second bandgap and the first bandgap The width of the edge region is, for example, at least 50 nm and at most 10 µm.

According to at least one embodiment of the radiation emitting semiconductor body, a band gap of the second semiconductor region is the same in the edge region and in the central region. In particular, the second semiconductor region has a third band gap in the central region and in the edge region. In particular, the third band gap of the second semiconductor region is the same in lateral directions and/or in vertical directions. That is, the band gap of the second semiconductor region, in particular the third band gap, deviates in lateral directions and/or in vertical direction in the central region and in the edge region by no more than 5%, in particular by no more than 1%, from an average value of the third band gap.

Furthermore, a band gap of the first semiconductor region is the same in the edge region and in the central region. In particular, the first semiconductor region has a fourth band gap in the central region and in the edge region. In particular, the fourth band gap of the first semiconductor region is the same in lateral directions and/or in vertical directions. That is, the band gap of the first semiconductor region, in particular the fourth band gap, deviates in lateral directions and/or in vertical directions in the central region and in the edge region by no more than 5%, in particular by no more than 1%, from an average value of the fourth band gap.

In at least one embodiment, the radiation emitting semiconductor body comprises a first semiconductor region of a first conductivity type, a second semiconductor region of a second conductivity type, and an active region between the first semiconductor region and the second semiconductor region. The active region has a larger band gap in an edge region of the semiconductor body than in a central region of the semiconductor body. Further, a band gap of the second semiconductor region is the same in the edge region and in the central region.

One idea of the radiation emitting semiconductor body described herein is, inter alia, to form an active region in such a way that it has a larger band gap in the edge region than in the central region. This advantageously suppresses the emission of electromagnetic radiation from the edge regions. Advantageously, a particularly homogeneous radiation characteristic and thus a particularly high efficiency can be achieved. In particular, non-radiative recombination (NRR) in the edge regions is suppressed by the larger band gap.

Furthermore, the second semiconductor region has a substantially isotropic band gap. Here, a course of the band gaps in the active region and in the second semiconductor region is decoupled. Advantageously, the second semiconductor region can thus be configured to be particularly thin. Due to the comparatively particularly thin embodiment of the second semiconductor region, a Purcell factor can be comparatively particularly large. Since the Purcell factor is proportional to an emission rate of the semiconductor body, the efficiency can thus also be high.

According to at least one embodiment of the radiation emitting semiconductor body, the active region in the edge region comprises a first dopant. The density of the first dopant in the active region in the edge region is, for example, substantially constant. Here, substantially constant means that the density may vary due to manufacturing. The density of the first dopant in the active region in the edge region is, for example, at least $10^{15}$ per $cm^3$, in particular at least $10^{16}$ per $cm^3$.

According to at least one embodiment of the radiation emitting semiconductor body, a density of the first dopant in a transition region of the semiconductor body between the edge region and the central region continuously decreases in lateral directions. In this case, the transition region is arranged in lateral directions in particular between the edge region and the central region.

In addition to the first dopant in the active region in the edge region, the active region in the edge region includes vacancies. A density of the vacancies scales with the density of the first dopant. In particular, the density of the vacancies is directly proportional to the density of the first dopant. In particular, the density of the first dopant predetermines, for example, the density of the vacancies in the active region in the edge region. Furthermore, the density of the vacancies predetermines the band gap in the active region in the edge region, in particular the second band gap. That is, the higher the density of the first dopant in the active region is predetermined, the higher the second band gap is.

According to at least one embodiment of the radiation emitting semiconductor body, a width of the transition region is at most as large as a thickness of the active region. The width of the transition region is, for example, a minimum distance in the lateral direction from the edge region to the central region. The transition region has the width of, for example, at least 2 nm and at most 500 nm.

If the semiconductor body has the barrier layer, then the width of the transition region is, for example, at most as large as a thickness of the active region and the barrier layer.

According to at least one embodiment of the radiation emitting semiconductor body, the active region in the central region is free of the first dopant. In particular, the active region in the central region is substantially free of the first dopant. Substantially free of the first dopant means here that a density of the first dopant in the active region in the central region is at most 5%, in particular at most 1%, of the density of the first dopant in the active region in the edge region.

According to at least one embodiment of the radiation emitting semiconductor body, the first dopant comprises a p-doping material. For example, the first dopant comprises or consists of Zn or Si.

According to at least one embodiment of the radiation emitting semiconductor body, the second semiconductor region comprises a second dopant. A density of the second dopant predetermines, for example, the band gap, in particular the third band gap, in the second semiconductor region in the edge region and in the central region.

For example, the density of the second dopant in the second semiconductor region is at least $10^{16}$ per $cm^3$, in particular at least $10^{17}$ per $cm^3$. In particular, a density of the second dopant in the second semiconductor region is substantially the same in the edge region and in the central region. Here, substantially the same means that a density of the second dopant in lateral directions and/or in vertical directions in the second semiconductor region does not deviate from an average value of the density of the second dopant in the second semiconductor region by more than 5%, in particular by not more than 1%.

For example, the second dopant comprises a p-doping material. In this case, the second dopant comprises or consists of Mg or Zn.

According to at least one embodiment of the radiation emitting semiconductor body, the second dopant and the first dopant are the same. In particular, the first dopant and the second dopant are Zn.

According to at least one embodiment of the radiation emitting semiconductor body, the second semiconductor region is free of the first dopant. In particular, the second semiconductor region is substantially free of the first dopant. Substantially free of the first dopant means here that a density of the first dopant in the second semiconductor region is at most 5%, in particular at most 1%, of the density of the first dopant in the active region in the edge region.

Alternatively or additionally, the first semiconductor region is free of the first dopant. In particular, the first semiconductor region is substantially free of the first dopant. Here, substantially free of the first dopant means that a density of the first dopant in the first semiconductor region is less than 0.1% of the density of the first dopant in the active region in the edge region.

According to at least one embodiment of the radiation emitting semiconductor body, the active region is free of the second dopant. Substantially free of the second dopant means here that a density of the second dopant in the active region is at most 5%, in particular at most 1%, of the density of the second dopant in the second semiconductor region.

According to at least one embodiment of the radiation emitting semiconductor body, the band gap of the active region in the edge region is larger than in the central region by at least 50 meV, at most 150 meV. That is, the first band gap is larger than the second band gap by at least 50 meV to at most 150 meV. For example, the first band gap is larger than the second band gap by about 80 meV.

Furthermore, a radiation emitting semiconductor chip is specified. All features and embodiments disclosed in connection with the radiation emitting semiconductor chip are therefore also disclosed in connection with the radiation emitting semiconductor, and vice versa.

According to at least one embodiment, the radiation emitting semiconductor chip comprises a radiation emitting semiconductor body described herein. The radiation emitting semiconductor chip is, for example, a light-emitting diode, LED for short.

In particular, the radiation emitting semiconductor chip is a micro-LED. If the radiation emitting semiconductor chip is a micro-LED, the radiation emitting semiconductor chip has an extension in lateral directions of at most 100 μm, in particular at most 50 μm or 10 μm.

According to at least one embodiment, the radiation emitting semiconductor chip comprises a first contact layer arranged on the first semiconductor region. The first contact layer is configured to introduce charge carriers, for example, into the first semiconductor region.

According to at least one embodiment, the radiation emitting semiconductor chip comprises a second contact layer arranged on the second semiconductor region. The second contact layer is configured to introduce charge carriers, for example, into the second semiconductor region.

The first contact layer and/or the second contact layer have, for example, a transparent conductive metal or a transparent conductive oxide (TCO). TCOs are transparent conductive materials and include, for example, zinc oxide, tin oxides, cadmium oxide, titanium oxide, indium oxide and/or indium tin oxide (ITO).

Alternatively, it is possible that the second contact layer comprises, for example, a reflective, electrically conductive metal. In this case, the second contact layer comprises, for example, one or more of the following materials or consists of one or more of these materials: Au, Ag, Al, Cu, Rh, Pd, Pt.

Furthermore, it is possible that a mirror layer is arranged on the second contact layer. In particular, the second contact layer and/or the mirror layer has a reflectivity of at least 90%, especially at least 95%, for the emitted electromagnetic radiation.

According to at least one embodiment of the radiation emitting semiconductor chip, the second contact layer is arranged on a carrier. The second contact layer is in electrically conductive contact with the carrier, for example.

The carrier is formed of or consists of, for example, a plastic, a metallic and/or ceramic metal. The carrier is or comprises, for example, a printed circuit board (PCB) or a leadframe.

A Method for producing a radiation emitting semiconductor body is further specified, by which, in particular, a radiation emitting semiconductor body described herein can be produced. All features and embodiments disclosed in connection with the radiation emitting semiconductor body are therefore also disclosed in connection with the method, and vice versa.

According to at least one embodiment of the method, a first semiconductor region having a first conductivity type is provided.

According to at least one embodiment of the method, an active region is applied on the first semiconductor region. In particular, the active region is applied epitaxially to the first semiconductor region.

According to at least one embodiment of the method, a bandgap of the active region is increased in an edge region of the semiconductor body to be produced. For example, the active region is doped to increase the band gap in the edge region. The doping creates, for example, vacancies in the active region in the edge region. The vacancies are configured, for example, to predetermine the band gap of the active region in the edge region.

According to at least one embodiment of the method, a second semiconductor region having a second conductivity type is applied. In particular, the second semiconductor region is grown epitaxially on the active region. For example, the second semiconductor region is applied after doping the active region.

Due to the growth of the second region after doping of the active region, a width of doped edge region in the active layer can be formed particularly small in lateral directions. Advantageously, semiconductor bodies can thus be produced having a particularly small lateral extent. Such a semiconductor body can have a maximum lateral extent between 100 nm and 10 μm inclusive.

In particular, in the process described herein, the first semiconductor region is provided first. For example, after the providing, the active region is applied. After the band gap of the active region is increased in the edge region, the application of the second semiconductor region follows in particular.

According to at least one embodiment of the method, doping is carried out to increase the band gap of the active region, wherein a first dopant is introduced into the active region in the edge region during doping of the active region.

For example, a p-doping material from a gas phase, a liquid phase or a solid phase is diffused into the active region in the edge region.

According to at least one embodiment of the method, a mask is applied to the active region prior to doping the active region such that the edge region is free of the mask. The mask covers, for example, the central region and a transition region arranged between the central region and the edge region.

In particular, the mask is configured in such a way that the first dopant cannot diffuse through this mask into the active region. In particular, the mask is thus not permeable to the first dopant.

For example, after the active region is applied, an intermediate layer is grown over the entire surface of the active region. The intermediate layer is, for example, a semiconductor composite material such as GaAs.

The intermediate layer is patterned, for example, before doping the active region in such a way that the edge region of the active region or the edge region of the barrier layer is exposed. Such structuring can be carried out by means of a lithographic process. In this case, the patterned intermediate layer forms the mask.

Alternatively or additionally, it is possible that a further intermediate layer is applied to the intermediate layer. The further intermediate layer is, for example, $SiO_2$, SiN or $SiO_n$. In this case, the mask is the further intermediate layer. In this case, it is possible that the intermediate layer is arranged over the entire surface of the active region and the further intermediate layer is arranged exclusively completely in the central region and in the transition region.

According to at least one embodiment of the method, the mask is removed before the second semiconductor region is applied. If the mask is formed by the further intermediate layer, the intermediate layer can also be removed before the second semiconductor region is applied. In particular, the intermediate layer and the further intermediate layer are removed in a common process step. The intermediate layer or the intermediate layer and the further intermediate layer are removed, for example, by means of a wet chemical etching process, for example, by using citric acid.

Advantageously, the intermediate layer protects the active region at least in some regions from external influences, in particular during doping. Thus, the second semiconductor region can be applied to the active region particularly well after removal of the mask.

According to at least one embodiment of the method, the second semiconductor region is doped with a second dopant during application. In this case, the second semiconductor region is generated independently of the doping of the active region. Furthermore, the second semiconductor region can be generated independently of a generation of the first semiconductor region. Advantageously, the second semiconductor region can thus be generated and doped in a growth system that is in particular different from a growth system of the first semiconductor region. Thus, a carryover of dopants can advantageously be minimized and the second semiconductor region can be embodied to be particularly thin.

BRIEF DESCRIPTION OF THE DRAWINGS

In the following, the radiation emitting semiconductor body, the radiation emitting semiconductor chip, and the method for producing a radiation emitting semiconductor body are explained in more detail with reference to exemplary embodiments and the accompanying Figures.

They show.

DETAILED DESCRIPTION OF ILLUSTRATIVE EMBODIMENTS

Elements that are identical, similar or have the same effect are given the same reference signs in the Figures. The Figures and the proportions of the elements shown in the Figures are not to be regarded as to scale. Rather, individual elements can be shown exaggeratedly large for better representability and/or for better comprehensibility.

Figure 1:
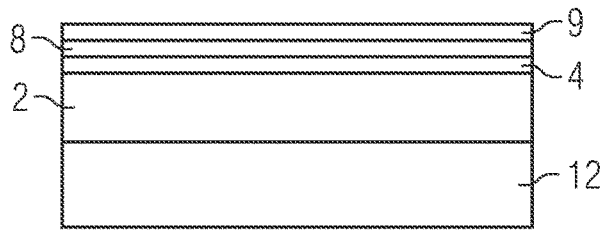
FIGS. 1 to 3 schematic sectional views of method stages in the production of a semiconductor body according to an exemplary embodiment, FIG. 4 a schematic cross-sectional view of a radiation emitting semiconductor chip according to an exemplary embodiment.
Figure 2:
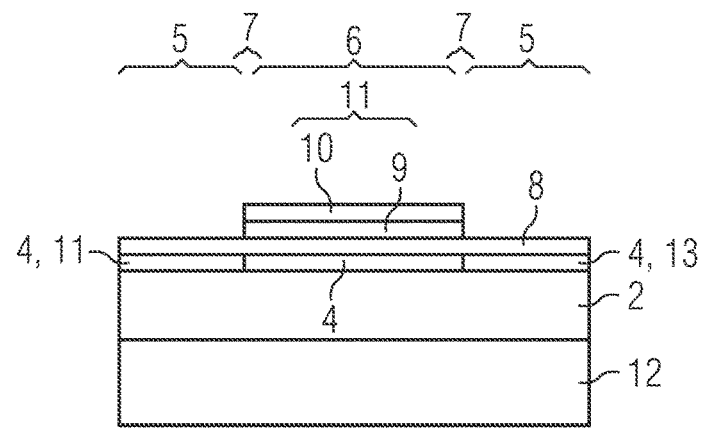
Figure 3:
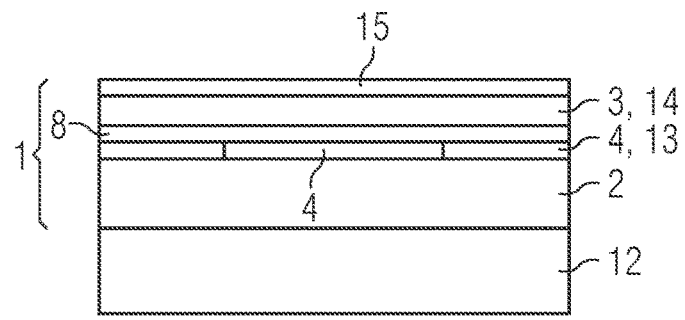

In the method according to the exemplary embodiment of the FIGS. 1, 2 and 3, a first semiconductor region 2 having a first conductivity type is provided according to FIG. 1. The first semiconductor region 2 is formed, for example, n-doped. Further, the first semiconductor region 2 is epitaxially formed on a substrate 12, for example. In particular, the substrate 12 is a growth substrate of the first semiconductor region 2.

In a further step, an active region 4 is applied, in particular over the entire surface, to the first semiconductor region 2. In addition, a barrier layer 8 is applied, in particular over the entire surface, to the active region 4. For example, the active region 4 is applied epitaxially to the first semiconductor region 2. Furthermore, the barrier layer 8 is applied epitaxially to the active region 4, for example.

In addition, after the application of the barrier layer 8, an intermediate layer 9 is applied to the barrier layer 8, in particular over the entire surface. For example, the intermediate layer 9 is also applied epitaxially.

The active region 4 and the barrier layer 8 comprise in particular indium gallium aluminum phosphide and the intermediate layer 9 comprises in particular gallium arsenide. Furthermore, the first semiconductor region 2 comprises in particular indium aluminum phosphide.

Subsequently, the intermediate layer 9 is structured as shown schematically in FIG. 2. The intermediate layer 9 is structured, for example, by a lithographic process. After patterning, the patterned intermediate layer 9 exclusively covers a central region 6 and a transition region 7 of the semiconductor body 1 to be produced. That is, the barrier layer 8 is exposed by removing the intermediate layer 9 in an edge region 5 which completely surrounds the central region 6.

Subsequently, a further intermediate layer 10 can be applied, in particular over the entire surface, to the intermediate layer 9 in the central region 6. Alternatively, it is possible for the further intermediate layer 10 to be applied to the intermediate layer 9, in particular over the entire surface, before the intermediate layer 9 is patterned. In this case, the intermediate layer 9 and the further intermediate layer 10 are structured using a lithographic process, for example, so that the barrier layer 8 is exposed in an edge region 5.

The intermediate layer 9 and the further intermediate layer 10 form a mask 11. In a further step, the active region 4 is doped with a first dopant 13 in the edge region 5. Here, the mask 11 prevents diffusion of the first dopant 13 into the central region 6. However, it is possible that the first dopant 13 diffuses in lateral directions in regions under the mask 11 during this step.

In this case, the active region 4 in the edge region 5 has a density of the first dopant 13 that is greater than a density of the first dopant 13 in the central region 6. Thus, the active region 4 in the edge region 5 has a band gap that is approximately 80 meV greater than a band gap in the central region 6.

Since the first dopant 13 is also diffused in lateral directions in regions under mask 11, the density of the first dopant 13 in the active region 4 decreases continuously from the edge region 5 to the central region 6. The region into which the first dopant 13 is diffused under the mask 11 corresponds to a transition region 7. The transition region 7 is arranged in lateral directions between the edge region 5 and the central region 6.

A width of the transition region 7 is at most as large as a thickness of the active region 4 and a thickness of the barrier layer 8. That is, the first dopant 13 can diffuse into the active region 4 under the mask 11 in lateral directions at most as far as the active region 4 and the barrier layer 8 are thick.

In a further process step, shown schematically in FIG. 3, the mask 11 is removed by means of an etching process. The mask 11, in particular the intermediate layer 9 and the further intermediate layer 10, are removed in such a way that the barrier layer 8 is completely exposed.

Subsequently, a second semiconductor region 3 is applied to the exposed barrier layer 8, which has a second conductivity type. The second semiconductor region 3 is, for example, p-doped. In particular, the second semiconductor region 3 is applied epitaxially to the barrier layer 8. In addition, the second semiconductor region 3 is doped with a second dopant 14 during application.

For example, the first dopant 13 and the second dopant 14 are different from each other. In this case, the first dopant 13 can be formed with Zn and the second dopant 14 with Mg. In particular, the second semiconductor region 3 is then free of the first dopant 13.

Alternatively, the first dopant 13 and the second dopant 14 are the same. In this case, the first dopant 13 and the second dopant 14 are formed with Zn.

In the case where the dopants 13, 14 are different or the same, the second semiconductor region 3, unlike the active region 4, has a band gap that is the same in lateral directions and/or in vertical directions in the edge region 5 and in the central region 6.

After the second semiconductor region 3 is applied, a termination layer 15 for passivating the second semiconductor region 3 is also grown on the second semiconductor region 3. The termination layer 15 comprises, for example, a semiconductor material such as GaAs.

Subsequently, the substrate 12 can be detached from the first semiconductor region 2 (not shown here).

Figure 4:
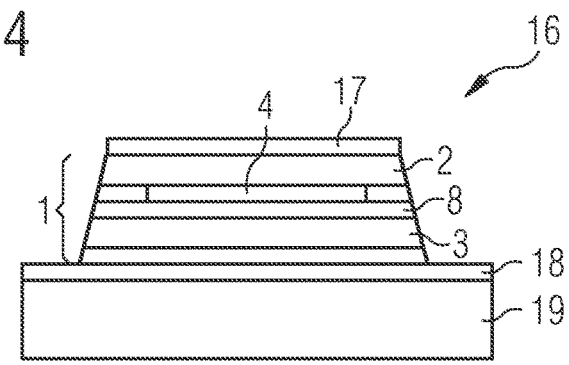

The radiation emitting semiconductor chip 16 according to the exemplary embodiment of FIG. 4 comprises a radiation emitting semiconductor body 1 produced, for example, by the method described in connection with FIGS. 1 to 3. The radiation emitting semiconductor body 1 includes a first semiconductor region 2, a second semiconductor region 3, and an active region 4 arranged between the first semiconductor region 2 and the second semiconductor region 3. In this case, a substrate 12, such as shown in connection with FIGS. 1 to 3, is removed from the first semiconductor region 2.

A first contact layer 17 is arranged on the first semiconductor region 2. Furthermore, a second contact layer 18 is arranged on the second semiconductor region 3.

In addition, the second contact layer 18 is arranged on a carrier 19. The second contact layer 18 is in electrically conductive contact with the carrier 19.

The features and exemplary embodiments described in connection with the Figures can be combined with each other according to further exemplary embodiments, even if not all combinations are explicitly described. Furthermore, the embodiments described in connection with the Figures can alternatively or additionally have further features according to the description in the general part.

The invention is not limited by the description on the basis of the exemplary embodiments. Rather, the invention encompasses any new feature as well as any combination of features, which in particular includes any combination of features in the patent claims, even if this feature or combination itself is not explicitly stated in the patent claims or exemplary embodiments.

The invention claimed is:

1. A radiation emitting semiconductor body comprising:
   a first semiconductor region of a first conductivity type;
   a second semiconductor region of a second conductivity type;
   an active region located between the first semiconductor region and the second semiconductor region; and
   a barrier layer arranged between the active region and the second semiconductor region,
   wherein the active region comprises InGaAlP,
   wherein the first conductivity type is n-conductive and the second conductivity type is p-conductive,
   wherein the active region has a larger band gap in an edge region of the semiconductor body than in a central region of the semiconductor body, and
   wherein a band gap of the second semiconductor region deviates in lateral directions and in vertical directions in the central region and in the edge region by no more than 5% from an average value of the band gap of the second semiconductor region.

2. The radiation emitting semiconductor body according to claim 1,
   wherein a density of a first dopant in a transition region of the semiconductor body between the edge region and the central region decreases continuously in the lateral directions, and
   wherein a width of the transition region is at most as large as a thickness of the active region.

3. The radiation emitting semiconductor body according to claim 2, wherein the active region in the central region is free of the first dopant.

4. The radiation emitting semiconductor body according to claim 1, wherein a first dopant comprises a p-doping material.

5. The radiation emitting semiconductor body according to claim 1, wherein the second semiconductor region comprises a second dopant.

6. The radiation emitting semiconductor body according to claim 5, wherein the second dopant and a first dopant are the same.

7. The radiation emitting semiconductor body according to claim 1, wherein the second semiconductor region is free of a first dopant.

8. The radiation emitting semiconductor body according to claim 7, wherein the active region is free of a second dopant.

9. The radiation emitting semiconductor body according to claim 1, wherein the band gap of the active region in the edge region is larger than in the central region by at least 50 meV to at most 150 meV.

10. A radiation emitting semiconductor chip comprising:
the radiation emitting semiconductor body according to claim 1;
a first contact layer arranged on the first semiconductor region; and
a second contact layer arranged on the second semiconductor region.

11. The radiation emitting semiconductor chip according to claim 10, wherein the second contact layer is arranged on a carrier.

12. A method for producing a radiation emitting semiconductor body, the method comprising:
providing a first semiconductor region having a first conductivity type, wherein the first conductivity type is n-conductive and a second conductivity type is p-conductive;
applying an active region on the first semiconductor region, wherein the active region comprises InGaAlP;
applying a barrier layer over an entire surface to the active region;
increasing a band gap of the active region in an edge region of the semiconductor body, wherein the band gap is increased by doping the edge region; and
applying a second semiconductor region having the second conductivity type after doping the active region,
wherein a band gap of the second semiconductor region deviates in lateral directions and in vertical directions in a central region of the semiconductor body and in the edge region by no more than 5% from an average value of the band gap of the second semiconductor region.

13. The method according to claim 12, wherein a first dopant is introduced into the active region in the edge region during doping of the active region.

14. The method according to claim 13, further comprising applying a mask to the active region before doping the active region such that the edge region is free of the mask.

15. The method according to claim 14, further comprising removing the mask before the second semiconductor region is applied.

16. The method according to claim 12, wherein the second semiconductor region is doped with a second dopant while applying the second semiconductor region.

17. A radiation emitting semiconductor body comprising:
a first semiconductor region of a first conductivity type;
a second semiconductor region of a second conductivity type;
an active region located between the first semiconductor region and the second semiconductor region; and
a barrier layer arranged between the active region and the second semiconductor region,
wherein the active region comprises InGaAlP,
wherein the first conductivity type is n-conductive and the second conductivity type is p-conductive,
wherein the active region has a larger band gap in an edge region of the semiconductor body than in a central region of the semiconductor body,
wherein the active region comprises a first dopant in the edge region, and
wherein a band gap of the second semiconductor region deviates in lateral directions and in vertical directions in the central region and in the edge region by no more than 5% from an average value of the band gap of the second semiconductor region.

\* \* \* \* \*